(12) United States Patent
Kobayashi et al.

(10) Patent No.: US 12,140,713 B2
(45) Date of Patent: *Nov. 12, 2024

(54) ULTRASONIC SENSOR

(71) Applicant: DENSO CORPORATION, Kariya (JP)

(72) Inventors: Kensuke Kobayashi, Nisshin (JP); Satoru Noro, Nisshin (JP)

(73) Assignee: DENSO CORPORATION, Kariya (JP)

( * ) Notice: Subject to any disclaimer, the term of this patent is extended or adjusted under 35 U.S.C. 154(b) by 511 days.

This patent is subject to a terminal disclaimer.

(21) Appl. No.: 17/470,309

(22) Filed: Sep. 9, 2021

(65) Prior Publication Data

US 2021/0405171 A1  Dec. 30, 2021

Related U.S. Application Data

(63) Continuation of application No. PCT/JP2020/007399, filed on Feb. 25, 2020.

(30) Foreign Application Priority Data

Mar. 11, 2019 (JP) .................................. 2019-044011

(51) Int. Cl.
*G01S 7/521* (2006.01)
*G01N 29/34* (2006.01)
(Continued)

(52) U.S. Cl.
CPC .............. *G01S 7/521* (2013.01); *G01N 29/34* (2013.01); *G01S 15/931* (2013.01); *H04R 1/08* (2013.01);
(Continued)

(58) Field of Classification Search
CPC ............. G01S 15/931; G01S 2015/938; G01S 2007/52009; G01S 7/521; H04R 17/02
See application file for complete search history.

(56) References Cited

U.S. PATENT DOCUMENTS

| 8,675,449 B2 * | 3/2014 | Mielenz | G01S 7/521 367/99 |
| 2018/0027337 A1 * | 1/2018 | Hsu | B81C 1/00158 257/416 |
| 2018/0351551 A1 | 12/2018 | Sawada et al. | |

FOREIGN PATENT DOCUMENTS

| CN | 102983851 A * | 3/2013 | ........... H03K 17/955 |
| CN | 102983851 B | 4/2017 | |

(Continued)

OTHER PUBLICATIONS

CN-102983851-A (machine translation) (Year: 2013).*
EP-3444605-B1 (machine translation) (Year: 2020).*

*Primary Examiner* — Luke D Ratcliffe
*Assistant Examiner* — Christopher Richard Walker
(74) *Attorney, Agent, or Firm* — MASCHOFF BRENNAN

(57) ABSTRACT

An ultrasonic sensor includes a first electrode, a second electrode, and a third electrode. The first electrode is provided an ultrasonic microphone that includes a vibration element that provides a function for converting between mechanical vibrations and electrical signals. The second electrode is externally from the ultrasonic microphone such that an electrical characteristic between the second electrode and the first electrode changes based on an adhesion state of substances adhering to the ultrasonic microphone. The third electrode is provided so as to suppress changes in the electrical characteristic between the first electrode and the second electrode caused by factors other than the adhesion of substances adhering to the ultrasonic microphone.

13 Claims, 9 Drawing Sheets

(51) Int. Cl.
*G01S 7/52* (2006.01)
*G01S 15/931* (2020.01)
*H04R 1/08* (2006.01)
*H04R 17/02* (2006.01)
*H10N 30/30* (2023.01)
*H10N 30/87* (2023.01)

(52) U.S. Cl.
CPC ............. *H04R 17/02* (2013.01); *H10N 30/30* (2023.02); *H10N 30/87* (2023.02); *G01S 2007/52009* (2013.01)

(56) References Cited

FOREIGN PATENT DOCUMENTS

| EP | 3 444 605 A1 | 2/2019 | | |
| EP | 3444605 B1 | * | 3/2020 | ............. G01H 11/08 |
| JP | S60-015577 A | | 1/1985 | |
| JP | 2010-181208 A | | 8/2018 | |

* cited by examiner

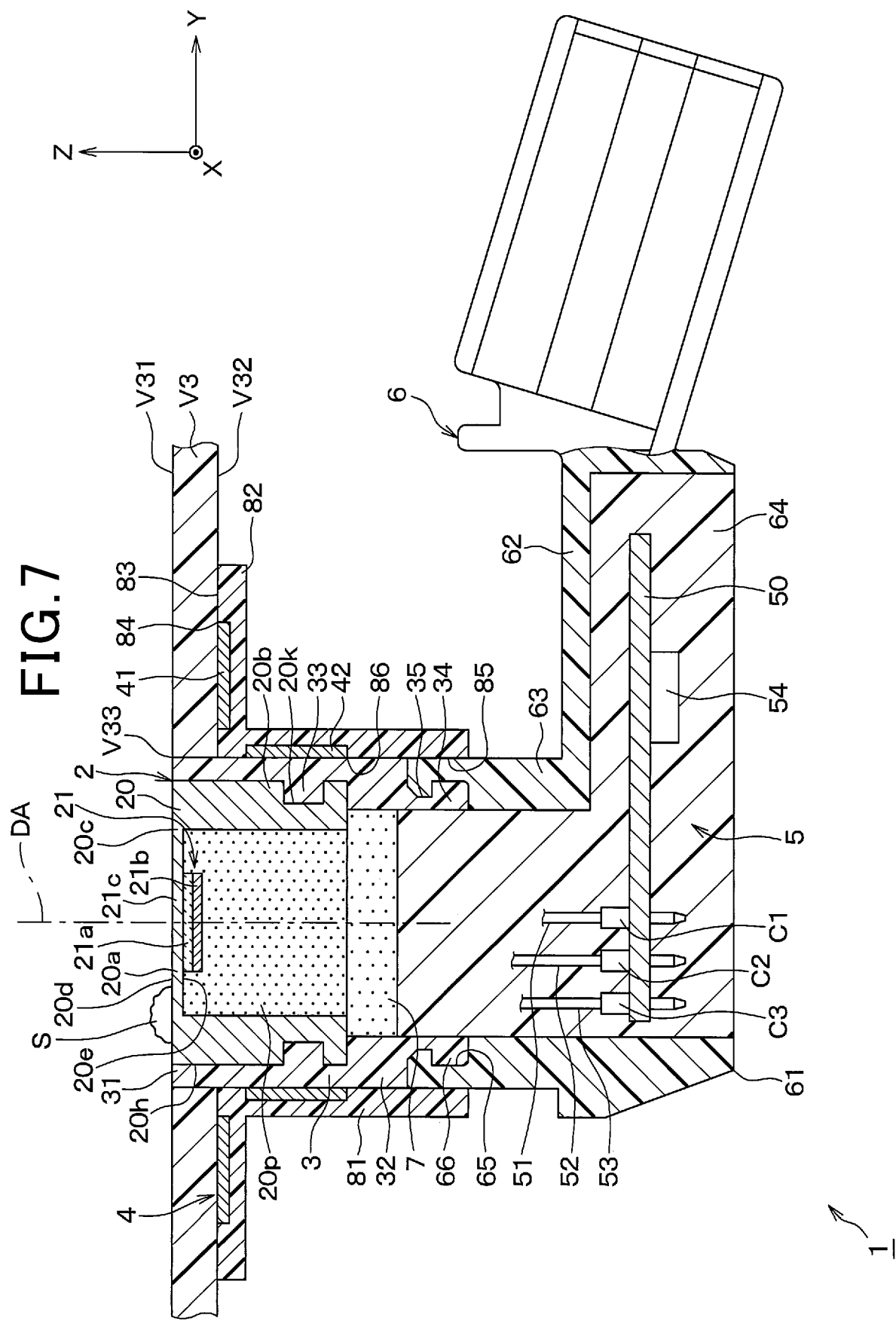

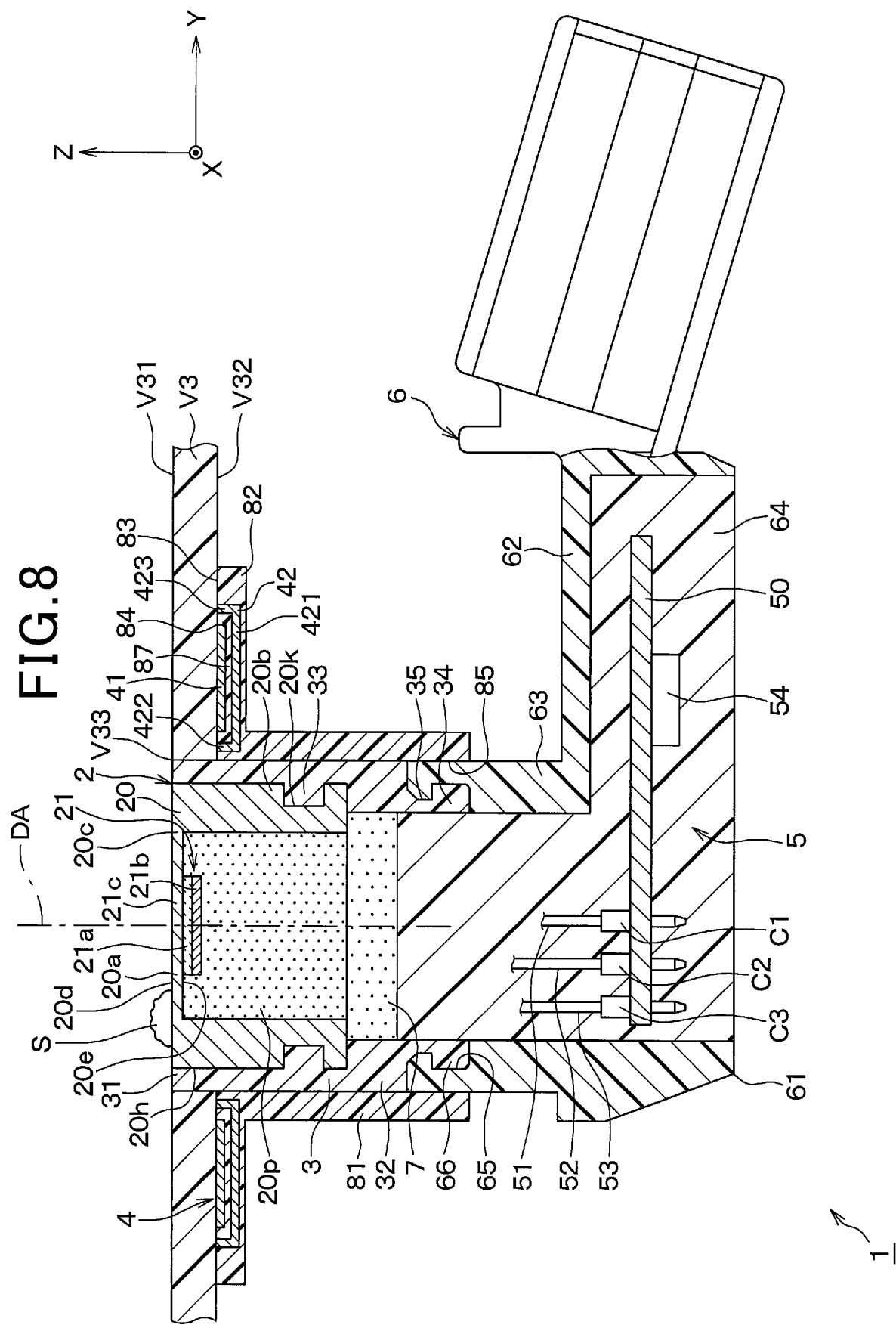

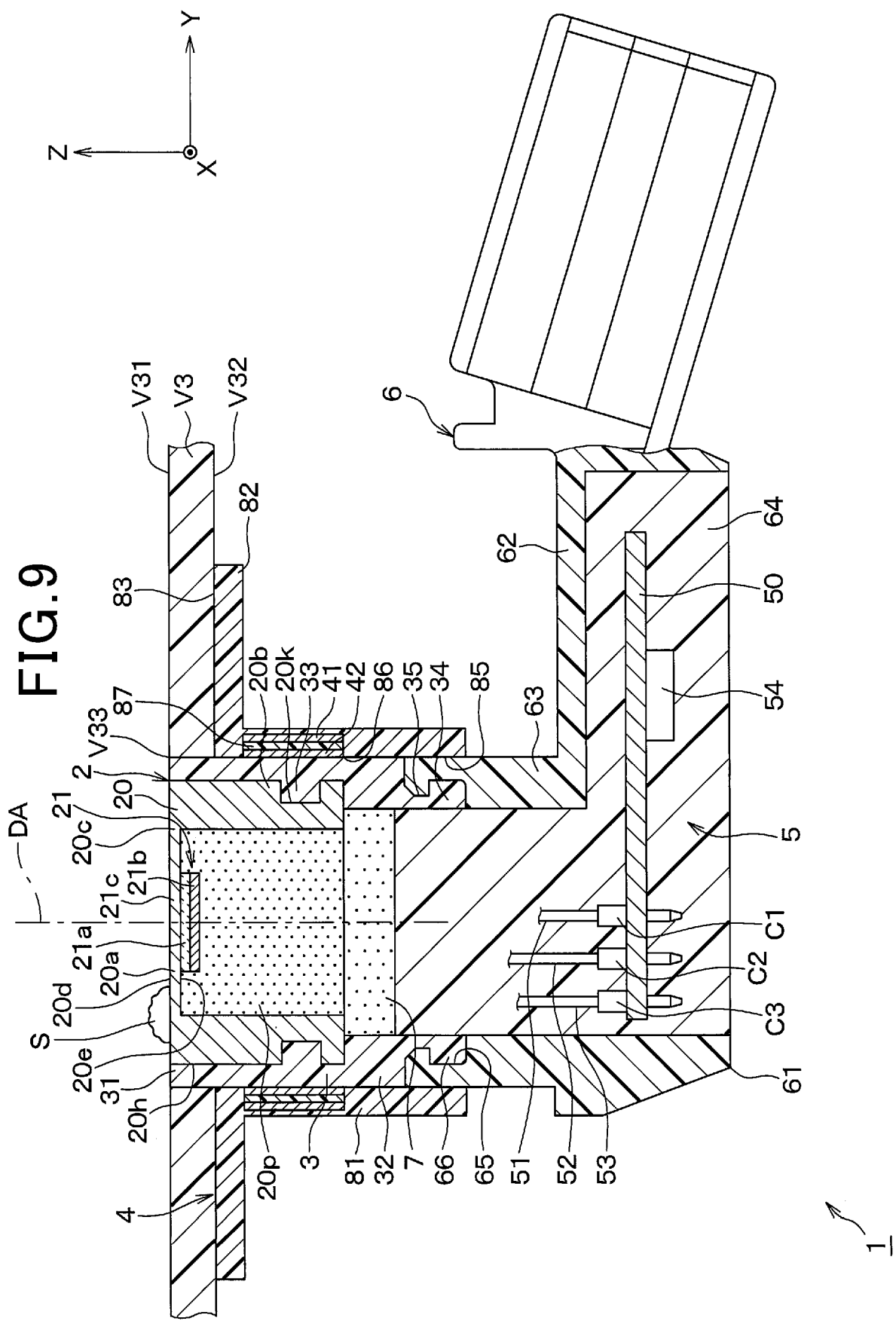

ULTRASONIC SENSOR

CROSS-REFERENCE TO RELATED APPLICATION

The present application is a continuation application of International Application No. PCT/JP2020/007399, filed on Feb. 25, 2020, which claims priority to Japanese Patent Application No. 2019-044011, filed on Mar. 11, 2019. The contents of these applications are incorporated herein by reference in their entirety.

BACKGROUND

Technical Field

The present disclosure relates to an ultrasonic sensor.

Related Art

An ultrasonic sensor that detects an object through transmission and reception of ultrasonic waves is known. This type of ultrasonic sensor transmits ultrasonic waves by exciting a diaphragm portion by a vibration element such as a piezoelectric element, and detects an object by converting, to electrical signals, vibrations of the diaphragm portion that accompany reception of reflected waves of the transmitted ultrasonic waves from an object.

SUMMARY

One aspect of the present disclosure provides an ultrasonic sensor that includes: a first electrode that is provided in an ultrasonic microphone that includes a vibration element that provides a function for converting between mechanical vibrations and electrical signals; a second electrode that is externally from the ultrasonic microphone such that an electrical characteristic between the second electrode and the first electrode changes based on an adhesion state of substances adhering to the ultrasonic microphone; and a third electrode that is provided so as to suppress changes in the electrical characteristic between the first electrode and the second electrode caused by factors other than the adhesion of substances adhering to the ultrasonic microphone.

BRIEF DESCRIPTION OF THE DRAWINGS

In the accompanying drawings:

FIG. 7 is a cross-sectional side view of an overall configuration of a modification of the ultrasonic sensor shown in FIG. 2;

FIG. 8 is a cross-sectional side view of an overall configuration of another modification of the ultrasonic sensor shown in FIG. 2;

FIG. 9 is a cross-sectional side view of an overall configuration of still another modification of the ultrasonic sensor shown in FIG. 2.

DESCRIPTION OF THE EMBODIMENTS

Figure 1:
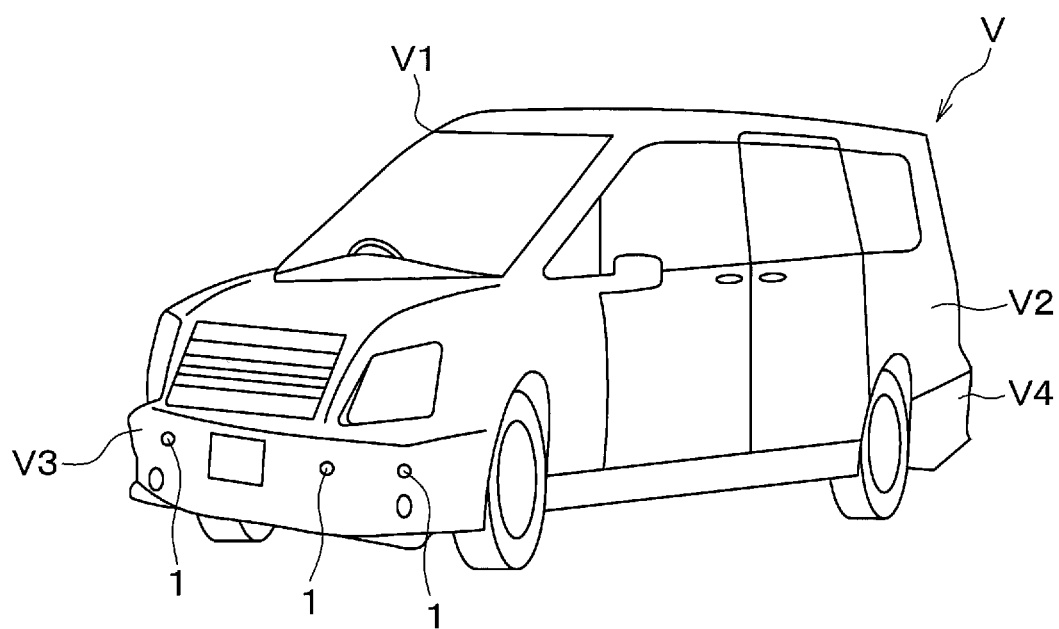
FIG. 1 is a perspective view of an outer appearance of a vehicle in which an ultrasonic sensor according to an embodiment is mounted.

Ultrasonic sensors are widely used in driving assistance, such as parking assistance, of a vehicle. In addition, use of ultrasonic sensors in automatic driving and the like of vehicles is anticipated. Furthermore, use of the ultrasonic sensor in applications other than vehicles is also anticipated. Specifically, for example, ultrasonic sensors may be used for unmanning or automating conveyors that are provided in factories and the like, agricultural equipment (such as cultivators), small aircraft, and the like.

An ultrasonic sensor that detects an object through transmission and reception of ultrasonic waves is known. Specifically, this type of ultrasonic sensor transmits ultrasonic waves by exciting a diaphragm portion by a vibration element such as a piezoelectric element. In addition, this type of ultrasonic sensor detects an object by converting, to electrical signals, vibrations of the diaphragm portion that accompany reception of reflected waves of the transmitted ultrasonic waves from an object.

In this type of ultrasonic sensor, when water, mud, snow, or the like adheres to the diaphragm portion, an issue arises in that transmission and reception of the ultrasonic waves are obstructed and object detection performance decreases. Therefore, conventionally, various configurations that enable adhesion of substances adhering to the ultrasonic sensor to be detected have been proposed. For example, JP-A-S60-015577 describes that, because an impedance of an ultrasonic vibration element changes as a result of adhering substances, detection of the adhering substances can be performed through detection of this change in impedance.

As described above, adhesion of substances adhering to the ultrasonic sensor causes decrease in detection performance of the ultrasonic sensor. Therefore, improving detection accuracy regarding substances adhering to the ultrasonic sensor is important in the various applications of the ultrasonic sensor. The present disclosure has been achieved in light of the issues given as examples above and the like.

An exemplary embodiment of the present disclosure provides an ultrasonic sensor that includes: a first electrode that is provided in an ultrasonic microphone that includes a vibration element that provides a function for converting between mechanical vibrations and electrical signals; a second electrode that is externally from the ultrasonic microphone such that an electrical characteristic between the second electrode and the first electrode changes based on an adhesion state of substances adhering to the ultrasonic microphone; and a third electrode that is provided so as to suppress changes in the electrical characteristic between the first electrode and the second electrode caused by factors other than the adhesion of substances adhering to the ultrasonic microphone.

In the above-described configuration, the electrical characteristics (such as an electrostatic capacitance) between the first electrode and the second electrode changes based on the adhesion state of substances adhering to the ultrasonic microphone. Meanwhile, these electrical characteristics can also change as a result of factors other than the adhesion of substances adhering to the ultrasonic microphone. In this regard, in the above-described configuration, the third electrode is provided. The third electrode is provided so as to suppress the changes in electrical characteristics between the first electrode and the second electrode caused by factors other than the adhesion of substances adhering to the ultrasonic microphone. Consequently, as a result of the above-described configuration, presence/absence of adhesion of adhering substances can be accurately detected based on the changes in electrical characteristics between the first electrode and the second electrode.

Here, reference numbers in parentheses may be attached to elements in the application documents. However, even in such cases, the reference numbers merely indicate examples of corresponding relationships between the elements and specific means described according to embodiments described hereafter. Therefore, the present disclosure is not limited in any way by the above-described reference numbers.

Embodiments

An embodiment of the present disclosure will hereinafter be described with reference to the drawings. Here, because understanding of the embodiment may be hindered as a result of modifications being inserted midway into a series of descriptions related to the embodiment, various modifications that are applicable to the embodiment will be collectively described following the descriptions of the embodiment.

Onboard Configuration

With reference to FIG. 1, according to the present embodiment, an ultrasonic sensor 1 is configured as an onboard sensor of which a vehicle V is a mounting subject. The vehicle V is a so-called four-wheeled automobile and includes a box-shaped vehicle body V1. A vehicle-body panel V2, a front bumper V3, and a rear bumper V4 that are vehicle-body components that configure an exterior shell are mounted to the vehicle body V1. The front bumper V3 is provided in a front end portion of the vehicle body V1. The rear bumper V4 is provided in a rear end portion of the vehicle body V1.

The ultrasonic sensor 1 is a so-called clearance sonar and is provided to detect an object in the vicinity of the vehicle V. Specifically, a plurality of (such as four) ultrasonic sensors 1 are attached to the front bumper V3. The plurality of ultrasonic sensors 1 that are mounted to the front bumper V3 are respectively arranged in differing positions in a vehicle-width direction. In a similar manner, a plurality of (such as four) ultrasonic sensors 1 are attached to the rear bumper V4.

Figure 2:
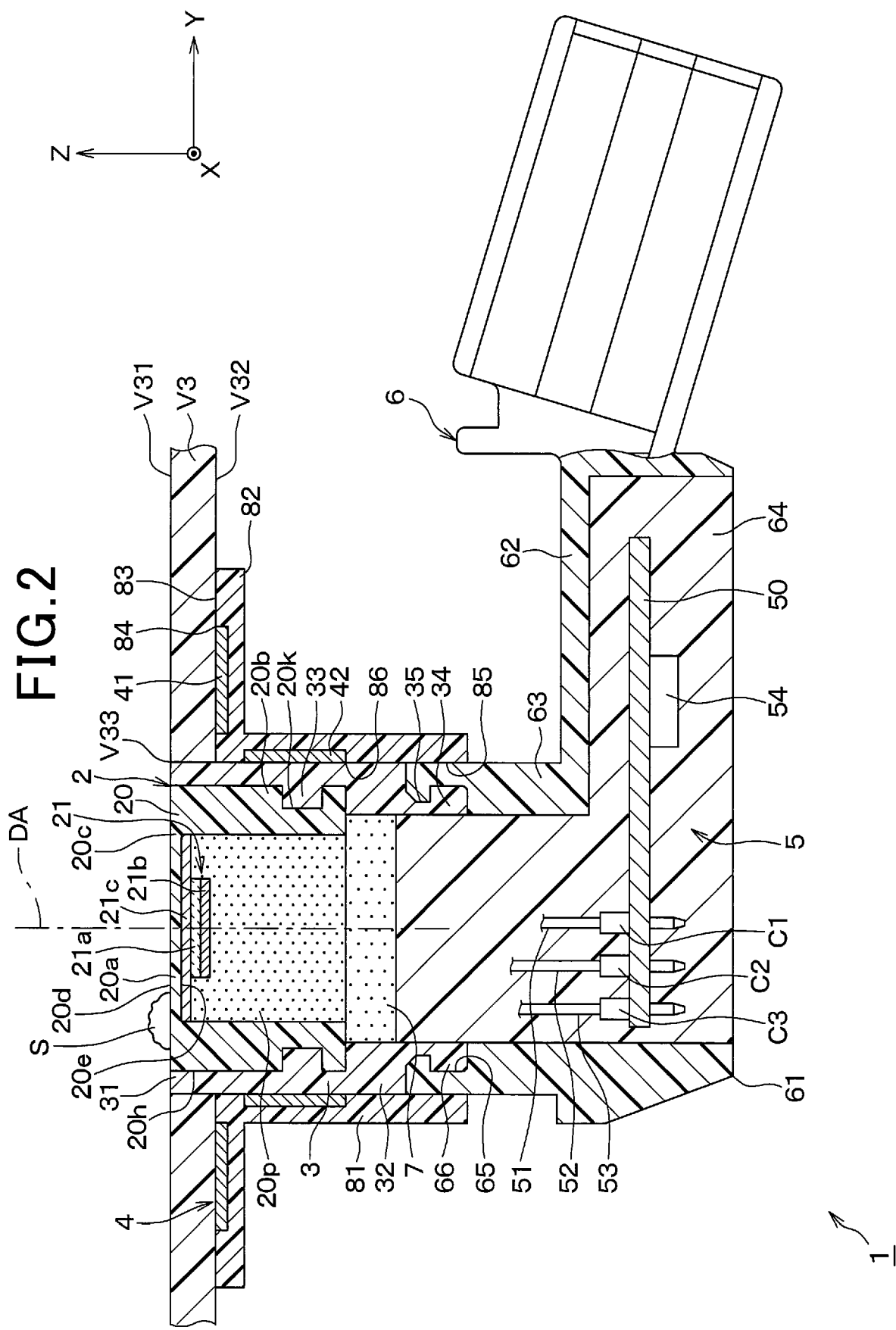
FIG. 2 is a cross-sectional side view of an overall configuration of the ultrasonic sensor according to the embodiment.

A configuration of the ultrasonic sensor 1 according to the present embodiment will be described below, with reference to FIGS. 2 to 4. With reference to FIG. 2, the ultrasonic sensor 1 is configured to be capable of transmitting and receiving ultrasonic waves. That is, the ultrasonic sensor 1 is configured to transmit a probe wave that is an ultrasonic wave along a directivity axis DA. The directivity axis is a virtual half-line that extends along a transmission/reception direction of the ultrasonic wave from the ultrasonic sensor 1, and serves as a reference for directional angle. The directivity axis may also be referred to as a directional center axis or a detection axis. In addition, the ultrasonic sensor 1 is configured to receive a reflected wave of the probe wave from an object that is present in the vicinity, and generate and output a detection signal that is based on a reception result.

For convenience of description, in FIG. 2, as shown in the drawing, a right-handed XYZ Cartesian coordinate system is set such that a Z-axis is parallel to the directivity axis DA. At this time, a direction that is parallel to the directivity axis DA is referred to as a directivity axis direction. A tip end side in the directivity axis direction is a transmission direction side of the probe wave and corresponds to an upper side in FIG. 2, that is, a Z-axis positive-direction side.

In contrast, a base end side in the directivity axis direction corresponds to a lower side in FIG. 2, that is, a Z-axis negative-direction side. In addition, a certain constituent element being viewed from the tip end side towards the base end side in a line of sight that is parallel to the directivity axis direction is referred to as a front view. A diagram of a front view is referred to as a front view. An end portion on the base end side in the directivity axis direction of a certain constituent element is referred to as a base end portion, and an end portion on the tip end side in the directivity axis direction is referred to as a tip end portion. Furthermore, an arbitrary direction that is orthogonal to the directivity axis direction is referred to as an in-plane direction. The in-plane direction is a direction that is parallel to an XY plane in FIG. 2.

FIG. 2 shows one of the plurality of ultrasonic sensors 1 that are attached to the front bumper V3 in a mounted state. The mounted state can also be referred to as a mounted state in which the ultrasonic sensor 1 is mounted to the front bumper V3 that configures the exterior shell of the vehicle V that is the mounting subject.

With reference to FIG. 2, the front bumper V3 includes a bumper outer surface V31 that is an outer surface and a bumper back surface V32 that is a back surface thereof. In addition, the front bumper V3 has an attachment hole V33 that is a through-hole for mounting the ultrasonic sensor 1. The attachment hole V33 is formed so as to pass through the front bumper V3 in the directivity axis direction, that is, a vehicle overall-length direction.

The ultrasonic sensor 1 includes an ultrasonic microphone 2, an elastic supporting member 3, an external electrode 4, an electrical circuit unit 5, a sensor case 6, and a cushioning member 7. In addition, the ultrasonic sensor 1 is mounted to the front bumper V3 via an auxiliary component 8. Configurations of these parts will be successively described below.

Ultrasonic Microphone

A configuration of the ultrasonic microphone 2 will be described below with reference to FIGS. 2 and 3. According to the present embodiment, a microphone case 20 that configures a casing of the ultrasonic microphone 2 has an outer shape that is a substantially circular columnar shape. Specifically, the microphone case 20 has a diaphragm portion 20a and a diaphragm supporting portion 20b.

The diaphragm portion 20a is formed into a thin sheet that has a thickness direction in the directivity axis direction. The diaphragm portion 20a is provided as a vibration plate that ultrasonically vibrates in such a manner that a center portion in the in-plane direction reciprocally moves along the directivity axis direction. That is, the diaphragm portion 20a is supported by the diaphragm supporting portion 20b in an outer edge portion 20c so as to bend and deform with the outer edge portion 20c in the in-plane direction as a fixed end.

A detection surface 20d that is an outer surface of the diaphragm portion 20a is formed into a smooth planar shape that is orthogonal to the directivity axis DA. An element fixing surface 20e on a back side of the detection surface 20d is formed into a smooth planar shape that is parallel to the detection surface 20d.

The diaphragm supporting portion 20b is formed into a cylindrical shape in which the directivity axis DA along a vibration direction of the diaphragm portion 20a is a center axis. Specifically, the diaphragm supporting portion 20b is formed into a substantially circular cylindrical shape that surrounds the directivity axis DA. The diaphragm supporting portion 20b is formed such that a base end portion is open towards the base end side in the directivity axis direction. Meanwhile, a tip end portion of the diaphragm supporting portion 20b is closed by the diaphragm portion 20a. That is, the microphone case 20 is formed into a bottomed cylindrical shape in which one end portion in the directivity axis direction is closed by the diaphragm portion 20a.

According to the present embodiment, the diaphragm portion 20a is formed into a shape that has a long direction and a short direction in a plane that is orthogonal to the directivity axis DA. Specifically, with reference to FIG. 3, the diaphragm portion 20a has a rectangular shape with rounded corners in a plane that is orthogonal to the directivity axis DA. The diaphragm supporting portion 20b has a thick portion 20f and a thin portion 20g in correspondence with this in-plane shape.

The thick portion 20f is a portion along the long direction, that is, a long-side direction of the diaphragm portion 20a and has a maximum thickness D1 in a direction that is parallel to a short-side direction. The thin portion 20g is a portion along the short direction, that is, the short-side direction of the diaphragm portion 20a and has a maximum thickness D2 in a direction that is parallel to the long-side direction. D2<D1. That is, according to the present embodiment, the thick portion 20f is provided in correspondence with the long side of the rectangular shape with rounded corners of the diaphragm portion 20a. In addition, the thin portion 20g is provided in correspondence with the short side of the rectangular shape with rounded corners of the diaphragm portion 20a.

An outer circumferential surface 20h of the diaphragm supporting portion 20b is formed into a substantially circular columnar shape that is parallel with the directivity axis DA. An engaging groove 20k is formed in the outer circumferential surface 20h in the thick portion 20f. The engaging groove 20k is a square groove that is used to support the microphone case 20 to the sensor case 6 via the elastic supporting member 3. The engaging groove 20k extends along the long direction, that is, the long-side direction of the diaphragm portion 20a.

According to the present embodiment, the microphone case 20 is seamlessly integrally formed by an insulating synthetic resin. In addition, a conductor portion 20n is provided on the outer circumferential surface 20h in the thick portion 20f. The conductor portion 20n configures a power supply path to the external electrode 4 and is formed by a highly conductive film such as a copper foil.

In the mounted state, the microphone case 20 is such that the diaphragm portion 20a is inserted into the attachment hole V33 and the detection surface 20d is exposed towards the outer side of the vehicle V. In addition, in the mounted state, the microphone case 20 is provided such that the diaphragm supporting portion 20b extends towards the bumper back surface V32 side from the attachment hole V33.

A space that has a substantially quadrangular columnar shape and is surrounded by the diaphragm portion 20a and the diaphragm supporting portion 20b is formed inside the microphone case 20. The space is filled with a vibration-proof material 20p that is composed of silicone rubber or the like.

The ultrasonic microphone 2 includes the microphone case 20 and a vibration element 21. That is, the microphone case 20 is configured to support the vibration element 21 that provides a function for converting between mechanical vibrations and electrical signals, while housing the vibration element 21.

The vibration element 21 is supported in a fixed manner by the diaphragm portion 20a on the element fixing surface 20e side. The vibration element 21 is attached to the element fixing surface 20e of the diaphragm portion 20a by an insulating adhesive. According to the present embodiment, the vibration element 21 is configured as a so-called piezoelectric element. Specifically, the vibration element 21 includes a piezoelectric body 21a, a driving electrode 21b, and a reference electrode 21c.

The piezoelectric body 21a is a sheet- or film-like member that has a thickness direction in the directivity axis direction, and is formed by a piezoelectric material such as piezoelectric ceramic. The piezoelectric body 21a is arranged between the driving electrode 21b and the reference electrode 21c in the directivity axis direction. Specifically, the vibration element 21 is formed by the driving electrode 21b, the piezoelectric body 21a, and the reference electrode 21c being joined while being laminated in the directivity axis direction in this order.

The driving electrode 21b is formed by a conductive metal film. The driving electrode 21b is provided on one main surface of the piezoelectric body 21a, that is, a main surface on the lower side in the drawing. The main surface refers to a surface that is orthogonal to the thickness direction in the sheet- or film-like portion. That is, according to the present embodiment, the driving electrode 21b is arranged further towards the base end side in the directivity axis direction than the reference electrode 21c is.

The reference electrode 21c is formed by a conductive metal film. The reference electrode 21c is provided on another main surface of the piezoelectric body 21a, that is, a main surface on the upper side in the drawing. Specifically, according to the present embodiment, the reference electrode 21c is joined to the diaphragm portion 20a via an insulating adhesive layer (not shown). The reference electrode 21c that serves as a first electrode that is provided in the ultrasonic microphone 2 is grounded during use of the ultrasonic sensor 1.

The vibration element 21 is configured to bend and deform the diaphragm portion 20a as a result of the piezoelectric body 21a deforming based on a drive voltage that is applied between the driving electrode 21b and the reference electrode 21c. In addition, the vibration element 21 is configured to generate an output voltage between the driving electrode 21b and the reference electrode 21c based on the deformation of the piezoelectric body 21a accompanying the bending and deformation of the diaphragm portion 20a.

Elastic Supporting Member

With reference to FIG. 2, the elastic supporting member 3 is provided so as to elastically support the microphone case 20, and suppress vibration propagation between the microphone case 20 and the sensor case 6. In addition, the elastic supporting member 3 is provided so as to suppress vibration propagation between the microphone case 20 and the front bumper V3 by being interposed between the microphone case 20 and the front bumper V3 in the mounted state. Specifically, the elastic supporting member 3 is a member that has a substantially circular cylindrical shape, and has rubber elasticity and non-conductivity. The elastic supporting member 3 is formed to have a center axis along the directivity axis direction.

The elastic supporting member 3 has a supporting cylindrical portion 31 and a base portion 32. The supporting cylindrical portion 31 is a portion on the tip end side in the directivity axis direction of the elastic supporting member 3, and is configured to elastically support the microphone case 20 while housing the microphone case 20. The base portion 32 is a portion on the base end side in the directivity axis direction of the elastic supporting member 3, and is fixed to the sensor case 6. According to the present embodiment, the elastic supporting member 3 is seamlessly integrally formed by silicone rubber or the like.

In the mounted state, a tip end portion of the supporting cylindrical portion 31 is sandwiched between an inner circumferential surface of the attachment hole V33 in the front bumper V3 and the outer circumferential surface 20h of the microphone case 20, while being inserted into the attachment hole V33. An engaging protrusion 33 that protrudes towards an inner side in a radial direction is provided on the base end side on an inner circumferential surface of the supporting cylindrical portion 31. The radial direction is a direction that is orthogonal to the directivity axis direction and is a direction that radially extends from the directivity axis DA. The engaging protrusion 33 is formed to engage with the engaging groove 20k that is provided in the microphone case 20.

A fixing protrusion 34 is provided in a base end portion on an outer circumferential surface of the base portion 32. The fixing protrusion 34 is formed so as to protrude towards the outer side in the radial direction. In addition, a fixing groove 35 is formed in a position that is adjacent to the fixing protrusion 34 in the directivity axis direction on the outer circumferential surface of the base portion 32. That is, the fixing groove 35 is provided further towards the tip end side in the directivity axis direction than the fixing protrusion 34 is. The fixing protrusion 34 and the fixing groove 35 extend in the circumferential direction. The circumferential direction is a circumferential direction of a circle within a virtual plane of which a center is an intersecting point between the virtual plane that is orthogonal to the directivity axis direction and the directivity axis DA.

Detection Electrode and Guard Electrode

The external electrode 4 is externally from the ultrasonic microphone 2. According to the present embodiment, a detection electrode 41 and a guard electrode 42 are provided as the external electrode 4. The detection electrode 41 and the guard electrode 42 are formed by a conductor, or more specifically, a good conductive metal. The detection electrode 41 and the guard electrode 42 are provided in positions that differ from that of the reference electrode 21c in the in-plane direction.

The detection electrode 41 that serves as a second electrode is provided such that an electrical characteristic between the detection electrode 41 and the reference electrode 21C changes based on an adhesion state of substances S adhering to the detection surface 20d of the ultrasonic microphone 2. Here, for example, the electrical characteristic may be specifically an impedance, a current, or an electrostatic capacitance. According to the present embodiment, the electrical characteristic is typically the electrostatic capacitance. More specifically, in the mounted state, the detection electrode 41 is provided near the microphone case 20 so as to be near the detection surface 20d of the ultrasonic microphone 2 in the directivity axis direction and the radial direction.

According to the present embodiment, the detection electrode 41 is formed into thin sheet or a thin film that is flat and has a thickness direction in the directivity axis direction. The detection electrode 41 is provided along the bumper back surface V32 of the front bumper V3. That is, in the mounted state, the detection electrode 41 is arranged near the attachment hole V33 while opposing the bumper back surface V32 in a closely adhered state. In addition, the detection electrode 41 is provided on an outer side of the microphone case 20 in the radial direction. Specifically, the detection electrode 41 is formed in a shape of a ring that surrounds the attachment hole V33 from a front view in the mounted state.

The guard electrode 42 that serves as a third electrode is provided so as to suppress changes in the electrical characteristic between the reference electrode 21c and the detection electrode 41 caused by factors other than the adhesion of substances S adhering to the detection surface 20d. The electrical characteristic here may be also specifically the impedance, the current, or the electrostatic capacitance, for example. According to the present embodiment, the electrical characteristic is typically the electrostatic capacitance.

The guard electrode 42 is provided on the outer side in the radial direction of the microphone case 20. In addition, the guard electrode 42 extends in the directivity axis direction along the diaphragm supporting portion 20b. Specifically, according to the present embodiment, the guard electrode 42 is a thin-sheet or thin-film member that has a thickness direction in the radial direction. The guard electrode 42 is formed into a circular cylindrical shape or a partial circular cylindrical shape that surrounds the directivity axis DA and extends in the directivity axis direction. The guard electrode 42 is arranged so as to oppose the outer circumferential surface 20h of the microphone case 20 via the elastic supporting member 3.

The guard electrode 42 is provided so as to be interposed between the reference electrode 21c and the detection electrode 41. Specifically, the guard electrode 42 is arranged further towards the outer side in the radial direction than the reference electrode 21c is. In addition, the guard electrode 42 is arranged further towards the inner side in the radial direction than the detection electrode 41 is. That is, according to the present embodiment, the guard electrode 42 is provided between the reference electrode 21c and the detection electrode 41 in the radial direction.

In addition, according to the present embodiment, the guard electrode 42 is arranged further towards the base end side in the directivity axis direction than the detection electrode 41 is. In this manner, the guard electrode 42 is provided in an area that is further towards the base end side in the directivity axis direction than the bumper outer surface V31 is, so as to provide a guard electrode function between the reference electrode 21c and the detection electrode 41. Furthermore, the guard electrode 42 is arranged so as to be separated from an inner edge in the radial direction of the detection electrode 41 such as not to be in direct contact or short-circuited with the detection electrode 41.

Circuit Configuration

The electrical circuit unit 5 includes a circuit board 50, a drive wiring 51, a detection wiring 52, and a guard wiring 53. The circuit board 50 and the drive wiring 51 are housed inside the sensor case 6. Portions on the base end side of the detection wiring 52 and the guard wiring 53 are housed inside the sensor case 6. Here, to prevent the drawings from becoming complicated, illustration of the drive wiring 51, the detection wiring 52, and the guard wiring 53 is partially omitted.

One end of the drive wiring 51 is electrically connected to the circuit board 50 by a first connector C1. Another end of the drive wiring 51 is electrically connected to the vibration element 21. That is, the drive wiring 51 is provided so as to apply a drive voltage to the vibration element 21.

One end of the detection wiring 52 that configures a power supply path to the detection electrode 41 is electrically connected to the circuit board 50 by a second connector C2. Another end of the detection wiring 52 is electrically connected to the detection electrode 41. According to the present embodiment, the detection wiring 52 is provided so as to include the conductor portion 20*n*, shown in FIG. 3, in a portion thereof.

One end of the guard wiring 53 that configures a power supply path to the guard electrode 42 is electrically connected to the circuit board 50 by a third connector C3. Another end of the guard wiring 53 is electrically connected to the guard electrode 42.

A control circuit apparatus 54 is mounted in the circuit board 50. The control circuit apparatus 54 is a so-called one-chip microcomputer that includes a CPU, an analog-to-digital (A/D) converter, a digital-to-analog (D/A) converter, and the like. The control circuit apparatus 54 is provided to control operations of the ultrasonic sensor 1. CPU is an abbreviation of Central Processing Unit.

Figure 4:
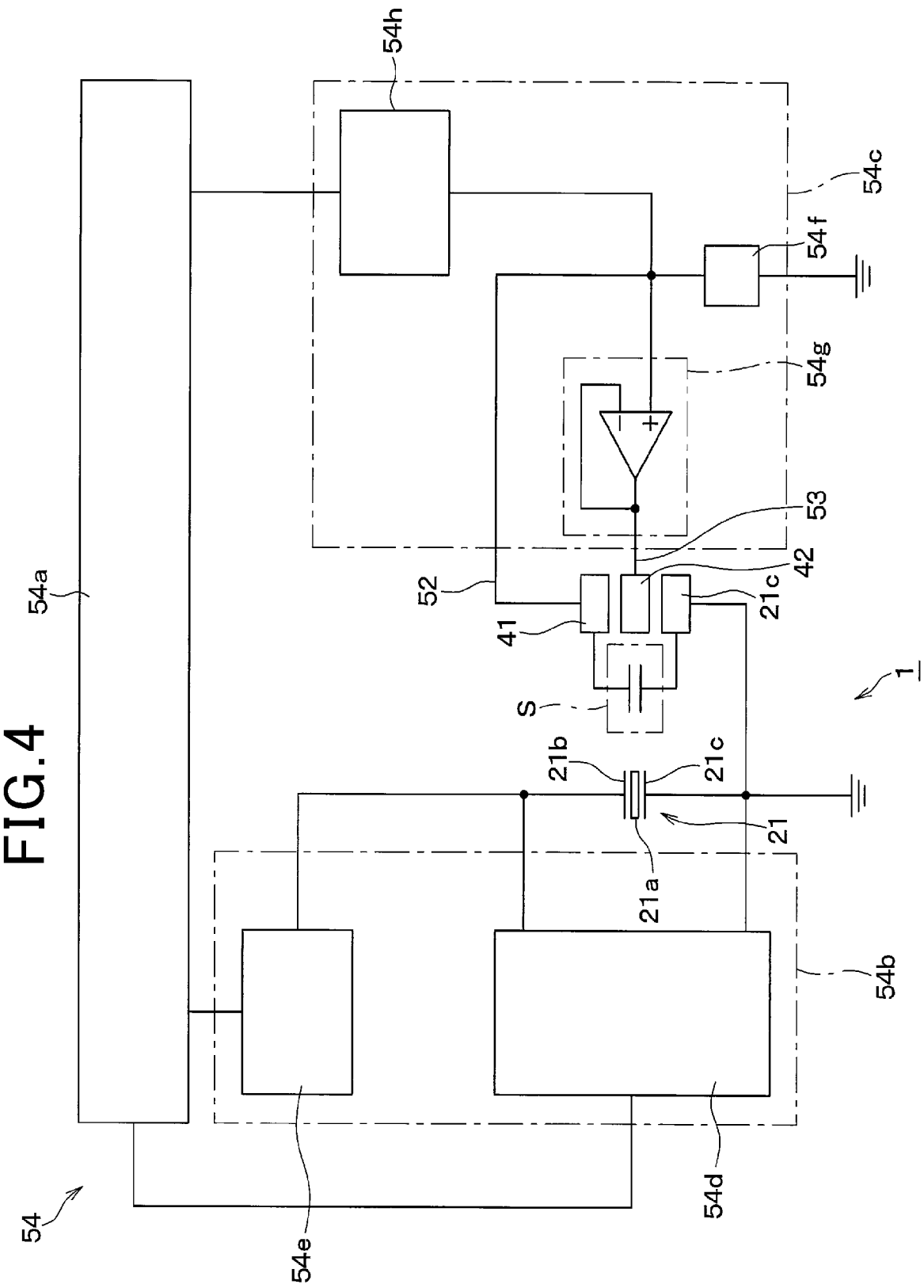
FIG. 4 is a block diagram of a schematic circuit configuration of the ultrasonic sensor shown in FIG. 2.

FIG. 4 shows a schematic circuit configuration of the ultrasonic sensor 1 according to the present embodiment, together with a functional configuration that is actualized in the control circuit apparatus 54 that is the one-chip microcomputer. As shown in FIG. 4, the control circuit apparatus 54 includes a control unit 54*a*, a signal transmitting/receiving unit 54*b*, and an impedance acquiring unit 54*c*.

The control unit 54*a* is provided so as to perform an object detection operation to detect an object in the vicinity of the ultrasonic sensor 1 when a predetermined object detection condition is met. For example, the object detection condition may include a shift position of the vehicle V in which the ultrasonic sensor 1 is mounted being a travel-enabling position, a vehicle speed of the same vehicle V being less than a predetermined value, and the like.

Specifically, the control unit 54*a* is provided so as to be capable of transmitting and receiving signals to and from the signal transmitting/receiving unit 54*b*. That is, the control unit 54*a* controls a transmission/reception operation for ultrasonic waves in the ultrasonic microphone 2 by controlling operation of the signal transmitting/receiving unit 54*b*.

The signal transmitting/receiving unit 54*b* is electrically connected to the vibration element 21 so as to transmit and receive electrical signals that include a drive signal and an output voltage signal to and from the vibration element 21. That is, the signal transmitting/receiving unit 54*b* is provided so as to input the drive signal to the vibration element 21 and receive the output voltage signal from the vibration element 21.

The signal transmitting/receiving unit 54*b* includes a transmission circuit 54*d* and a reception-wave processing circuit 54*e*. The transmission circuit 54*d* is electrically connected to the vibration element 21. The transmission circuit 54*d* is configured to make the vibration element 21 perform a transmission operation of an ultrasonic-band probe wave by inputting the drive signal to the vibration element 21.

The reception-wave processing circuit 54*e* is electrically connected to the vibration element 21. The reception-wave processing circuit 54*e* is configured to perform signal processing such as amplification on the output voltage signal that is generated by the vibration element 21 as a result of the diaphragm portion 20*a* being excited. Specific circuit configurations of the transmission circuit 54*d* and the reception-wave processing circuit 54*e* are known. Therefore, in the present specification, further descriptions of the transmission circuit 54*d* and the reception wave processing circuit 54*e* are omitted.

The control unit 54*a* is provided so as to detect a presence/absence of adhering substances S using the impedance acquiring unit 54*c* at a timing at which the object detection operation is not performed. Specifically, the control unit 54*a* is provided so as to be capable of transmitting and receiving signals to and from the impedance acquiring unit 54*c*. The impedance acquiring unit 54*c* includes a driver circuit 54*f*, a guard voltage applying unit 54*g*, and a receiver circuit 54*h*.

An ungrounded output terminal of the driver circuit 54*f* is electrically connected to the detection electrode 41 by the detection wiring 52. That is, the driver circuit 54*f* is provided so as to output a power supply voltage to acquire an impedance between the reference electrode 21*c* and the detection electrode 41.

In addition, the ungrounded output terminal of the driver circuit 54*f* is electrically connected to the guard electrode 42 by the guard wiring 53 and the guard voltage applying unit 54*g*. The guard wiring 53 is provided between the guard electrode 42 and the guard voltage applying unit 54*g* so as to electrically connect the guard electrode 42 and the guard voltage applying unit 54*g*.

The guard voltage applying unit 54*g* is provided so as to supply power to the guard electrode 42 while performing circuit separation of the guard electrode 42 and the driver circuit 54*f*. Specifically, according to the present embodiment, the guard voltage applying unit 54*g* is configured by a voltage follower. In this manner, the impedance acquiring unit 54*c* is configured such that the detection electrode 41 and the guard electrode 42 have a same potential when power is supplied to the detection electrode 41 and the guard electrode 42.

In addition, the ungrounded output terminal of the driver circuit 54*f* is electrically connected to the receiver circuit 54*h*. The receiver circuit 54*h* has a known integration circuit or the like, and is configured to generate output that corresponds to the impedance between the reference electrode 21*c* and the detection electrode 41. A principle of acquisition, that is, measurement of the impedance and specific circuit configurations of the driver circuit 54*f* and the receiver circuit 54*h* are known. Therefore, in the present specification, further descriptions thereof are omitted.

As described above, the impedance acquiring unit 54*c* is provided so as to acquire the impedance between the reference electrode 21*c* and the detection electrode 41. In addition, the control unit 54*a* is provided so as to acquire changes in the acquired impedance, and detect the adhesion of substances S adhering to the detection surface 20*d* based on the changes. That is, the ultrasonic sensor 1 according to the present embodiment is configured to be capable of detecting the adhesion of substances S adhering to the detection surface 20*d* based on the electrical characteristic, that is, the electrostatic capacitance between the reference electrode 21*c* and the detection electrode 41.

Casing

With reference again to FIG. 2, the sensor case 6 that configures a casing of the ultrasonic sensor 1 is integrally formed by a hard insulating synthetic resin such as polybutylene terephthalate. Specifically, a case main body 61 that forms a main portion of the sensor case 6 includes a board housing portion 62 and a protruding portion 63. The board housing portion 62 and the protruding portion 63 are seamlessly integrally formed.

The board housing portion 62 is formed into a bathtub-like shape, that is, a box shape that is open towards the base end side in the directivity axis direction. The protruding portion 63 is a substantially circular cylindrical portion that has a center axis that is parallel to the directivity axis direction, and protrude towards the tip end side in the directivity axis direction from the board housing portion 62. The case main body 61 is formed such that a space on an inner side of the board housing portion 62 and a space on an inner side of the protruding portion 63 communicate with each other.

The circuit board 50 is housed in the board housing portion 62. The spaces inside the board housing portion 62 and the protruding portion 63 are filled with a sealing resin 64. The sealing resin 64 is formed by a synthetic resin such as silicone rubber that has high insulation properties, a low dielectric constant, chemical stability, and weather resistance.

The protruding portion 63 is configured to hold the elastic supporting member 3 in a tip end portion in the directivity axis direction. Specifically, a supporting groove 65 and a supporting protrusion 66 are provided in the tip end portion on an inner circumferential surface of the protruding portion 63. The supporting groove 65 is formed so as to engage with the fixing protrusion 34 of the elastic supporting member 3. The supporting protrusion 66 is formed so as to engage with the fixing groove 35 of the elastic supporting member 3

The cushioning member 7 is a circular disk-shaped member and has an outer diameter that corresponds to an inner diameter of the elastic supporting member 3. That is, the cushioning member 7 is fitted into a cylindrical space on the inner side of the elastic supporting member 3, further towards the base end side than a portion that elastically supports the ultrasonic sensor 1 in the directivity axis direction is. The cushioning member 7 is formed by a foamed elastic body, such as foamed silicone, that has insulating properties and elasticity so as to suppress vibration transmission from the ultrasonic sensor 1 to the sensor case 6.

Mounting Components

The auxiliary component 8 is formed by a hard insulating synthetic resin such as polybutylene terephthalate. The auxiliary component 8 is a component that is used to mount the ultrasonic sensor 1 to the vehicle V, and is formed as a component that is separate from the sensor case 6. That is, the auxiliary component 8 is configured to hold the ultrasonic sensor 1 to the front bumper V3 by being fixed to the front bumper V3 and the sensor case 6 in the mounted state. Specifically, the auxiliary component 8 includes a holding portion 81 and a flange portion 82.

The holding portion 81 is formed into a substantially circular cylindrical shape that surrounds the protruding portion 63 of the sensor case 6 and the elastic supporting member 3. That is, the holding portion 81 is provided so as to hold the protruding portion 63 of the sensor case 6 and the elastic supporting member 3. The flange portion 82 extends towards the outer side in the radial direction from the tip end portion of the holding portion 81. The flange portion 82 is fixed to the bumper back surface V32 by an adhesive layer (not shown), such as a double-sided tape, in a portion that is on the outer side in the radial direction.

According to the present embodiment, the detection electrode 41 is provided in the auxiliary component 8. Specifically, the detection electrode 41 is fixed on a bumper opposing surface 83 side of the flange portion 82 so as to be flush with the bumper opposing surface 83 that is a surface of the flange portion 82 that opposes the bumper back surface V32 in the mounted state. That is, the detection electrode 41 is housed or embedded in a ring-shaped recessing portion 84 that is a shallow groove that is formed in the bumper opposing surface 83. In addition, the detection electrode 41 is arranged in a position that is towards the inner side in the radial direction of the flange portion 82.

Furthermore, according to the present embodiment, the guard electrode 42 is provided in the auxiliary component 8. Specifically, the guard electrode 42 is fixed on an inner circumferential surface 85 side so as to be flush with the inner circumferential surface 85 that is a circular cylindrical surface of the holding portion 81. That is, the guard electrode 42 is housed or embedded in a cylindrical recessing portion 86 that is a shallow groove that is formed in the inner circumferential surface 85. In addition, the guard electrode 42 is arranged in a position towards the tip end side in the directivity axis direction of the holding portion 81.

Operation Overview

An overview of operations of the configuration according to the present embodiment will be described below with reference to the drawings, together with effects achieved by the configuration. Here, operation examples below are merely examples given to briefly describe the present embodiment.

After an ignition switch of the vehicle V is turned ON at time t0, until the object detection condition is met at time t1, neither transmission of a probe wave from the ultrasonic sensor 1 nor reception of a reflected wave by the ultrasonic sensor 1 is performed. When the object detection condition is met at time t1, the object detection operation is performed by the ultrasonic sensor 1 performing transmission of the probe wave and reception of the reflection wave. Subsequently, when the object detection condition is no longer met at time t2 as a result of the vehicle speed increasing, the object detection operation is stopped. Then, when the object detection condition is met again at time t3 as a result of the vehicle speed decreasing for parking, transmission of a probe wave and reception of a reflected wave are started again.

According to the present embodiment, an adhering substance detection operation is not performed during time t1 to t2 that is a timing at which the object detection condition is met and the object detection operation is performed. The adhering substance detection operation is an operation for detecting the presence/absence of substances S adhering to the ultrasonic sensor 1. In a similar manner, at time t3 and subsequent thereto, the adhering substance detection operation is not performed until the object detection condition is again no longer met.

Meanwhile, the adhering substance detection operation is performed from time t0 to t1 and/or from t2 to t3 that are timings at which the object detection operation is not performed. That is, according to the present embodiment, the adhering substance detection operation is performed at a timing at which transmission of a probe wave is not performed and reception of a reflected wave is not performed. As a result, adhering substance detection can be performed while favorable object detection accuracy is maintained.

With reference to FIGS. 1 and 2, the ultrasonic sensor 1 is typically mounted to the front bumper V3 such that the directivity axis direction is substantially orthogonal to a vehicle-height direction. Therefore, a component that is parallel to the vibration direction of the diaphragm portion 20*a* is hardly generated in a gravitational force that acts on the substances S adhering to the detection surface 20*d* of the microphone case 20.

Therefore, in the ultrasonic microphone 2, the impedance of an equivalent circuit for mechanical vibrations hardly changes depending on the presence/absence of the adhering substances S. In particular, in cases in which the adhering substances S are light-weight substances such as snow or water as well, the impedance of the equivalent circuit for mechanical vibrations changes very little depending on the presence/absence of the adhering substances S. Therefore, adhesion of light-weight substances such as snow and water is difficult to detect by the impedance of the equivalent circuit for mechanical vibrations. In addition, adhesion of light-weight substances such as snow and water is difficult to detect by a conventionally known adhering substance detection method for substances S adhering to the ultrasonic sensor 1 using reverberation time.

In this regard, in the configuration according to the present embodiment, the electrical characteristic, or specifically, the electrostatic capacitance between the reference electrode 21*c* and the detection electrode 41 changes based on the adhesion state of substances S adhering to the detection surface 20*d*. Therefore, the control unit 54*a* acquires the impedance between the reference electrode 21*c* and the detection electrode 41. As a result, the changes in the electrostatic capacitance between the reference electrode 21*c* and the detection electrode 41 is acquired. Consequently, as a result of this configuration, the presence/absence of adhering substances S can be detected based on the changes in the electrical characteristic, that is, the electrostatic capacitance between the reference electrode 21*c* and the detection electrode 41.

As a result of the configuration according to the present embodiment, the presence/absence of the adhesion of adhering substances S can be accurately detected even when a component that is parallel to the vibration direction of the diaphragm portion 20*a* is hardly generated in the gravitational force that acts on the substances S adhering to the detection surface 20*d*. In addition, as a result of this configuration, even when the adhering substances S are light-weight substances such as snow or water, the presence/absence of the adhesion of adhering substances S can be accurately detected.

Here, as the adhering substance detection method for substances S adhering to the ultrasonic sensor 1, a method in which a resistance value between electrodes is used can be considered. However, this method is difficult to use in terms of oxidation of the electrodes, prevention of electrocution of people in the vicinity, design issues, and the like. In actuality, an insulating film is ordinarily formed on the surface of the microphone case 20 as according to the present embodiment to prevent corrosion and the like.

In this regard, as a result of the configuration according to the present embodiment, the presence/absence of adhering substances S can be detected based on the changes in the electrostatic capacitance between the reference electrode 21*c* and the detection electrode 41. Therefore, as a result of this configuration, even when the insulating film is formed on the surface of the microphone case 20, the presence/absence of the adhesion of adhering substances S can be accurately detected.

As described above, as a result of the adhering substance detection method based on the changes in the electrical characteristic, that is, the electrostatic capacitance between the reference electrode 21*c* and the detection electrode 41, as according to the present embodiment, the presence/absence of the adhesion of adhering substances S can be more accurately detected than by other methods. However, the electrical characteristic between the reference electrode 21*c* and the detection electrode 41 may change as a result of factors other than the adhesion of substances S adhering to the detection surface 20*d*. Therefore, a following issue can be considered.

For example, when the adhering substance S is water, the adhesion state on the detection surface 20*d* may be resolved in a relatively short amount of time by gravitational force, evaporation, or the like. In contrast, when the adhering substance S is snow, a duration of the adhesion state is relatively long. Therefore, detecting the adhesion of snow is more important than detecting the adhesion of water.

In this regard, a relative dielectric constant of water is about 80. Meanwhile, the relative dielectric constant of snow is about 3. Therefore, in a configuration in which the guard electrode 42 is not present, for example, the changes in the electrostatic capacitance between the reference electrode 21*c* and the detection electrode 41 are greater when condensation is formed on the bumper back surface V32 side than when snow adheres to the detection surface 20*d*.

In a similar manner, gaps into which water is able to infiltrate are present in two locations between the holding portion 81 of the auxiliary component 8 and the microphone case 20. Specifically, water may infiltrate between the outer circumferential surface 20*h* of the microphone case 20 and the elastic supporting member 3. In addition, water may infiltrate between the elastic supporting member 3 and the holding portion 81. The changes in the electrostatic capacitance between the reference electrode 21*c* and the detection electrode 41 are greater when water infiltrates these gaps than when snow adheres to the detection surface 20*d*.

Furthermore, a wire harness may be present on the inner side of the components that configure the exterior shell of the vehicle V including the front bumper V3. The wire harness may move and vibrate in an irregular manner during traveling of the vehicle V. A parasitic capacitance between the reference electrode 21*c* and the detection electrode 41 may change in accompaniment with the movement or vibration.

In this regard, in the configuration according to the present embodiment, the guard electrode 42 is provided together with the detection electrode 41. The guard electrode 42 is provided so as to suppress the changes in the electrical characteristic (that is, the electrostatic capacitance) between the reference electrode 21*c* and the detection electrode 41 that are caused by factors other than the adhesion of substances S adhering to the detection surface 20*d*. That is, the guard electrode 42 is provided so as to be interposed between the reference electrode 21*c* and the detection electrode 41.

Here, "interpose" in this case refers to the guard electrode 42 being electrostatically interposed so as to suppress the changes in the electrical characteristic between the reference electrode 21*c* and the detection electrode 41 that are caused by factors such as water or the wire harness on the inner side of the components that configure the exterior shell of the vehicle V. Therefore, the guard electrode 42 is not required to be arranged on a virtual line that connects the reference electrode 21*c* and the detection electrode 41 from a cross-sectional side view, as long as the guard electrode 42 is interposed between the reference electrode 21*c* and the detection electrode 41 so as to achieve the guard electrode function.

Figure 5:
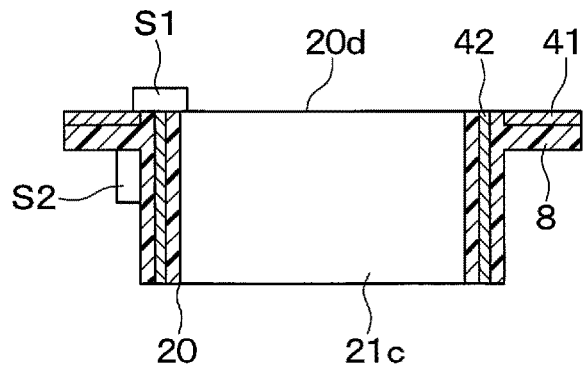
FIG. 5 is an explanatory diagram of conditions of a computer simulation for verifying effects of the configuration of the ultrasonic sensor according to the embodiment.

FIG. 5 shows simulation conditions for verifying the effects achieved by the configuration according to the present embodiment by a computer simulation. In the present simulation, following changes are made to the configuration described above for simplification of computational conditions. First, as in a modification described hereafter, the overall microphone case 20 that is composed of a good conductive metal such as aluminum serves as the reference electrode 21*c*. In addition, the detection electrode 41 is exposed on the outer surface of the vehicle V. Furthermore, the overall side of the reference electrode 21*c* is covered with the guard electrode 42.

In a calculation model shown in FIG. 5, an overall area that has a substantially circular columnar shape that configures the microphone case 20, that is, the reference electrode 21*c* was set to 0 V. In addition, the detection electrode 41 and the guard electrode 42 were set to 1 V. Furthermore, the electrostatic capacitance between the reference electrode 21*c* and the detection electrode 41 was calculated for three situations below.

Situation 1: no adhering substance;
Situation 2: snow S1 adhering to the detection surface 20*d*; and
Situation 3: water S2 adhering to the auxiliary component 8.

Figure 6A:
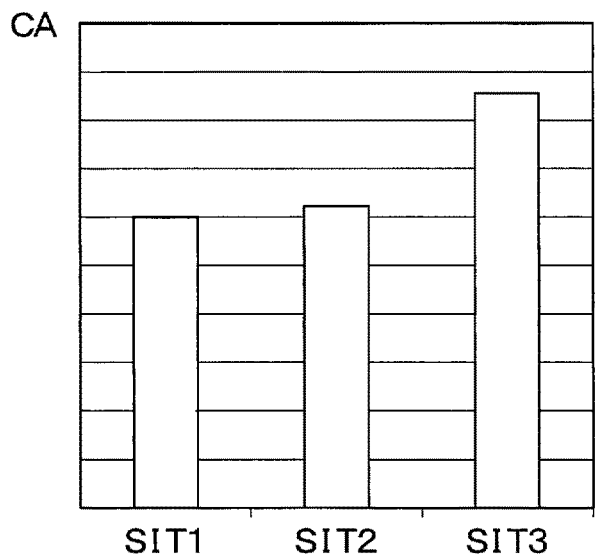
FIG. 6A is a graph of results of the computer simulation.
Figure 6B:
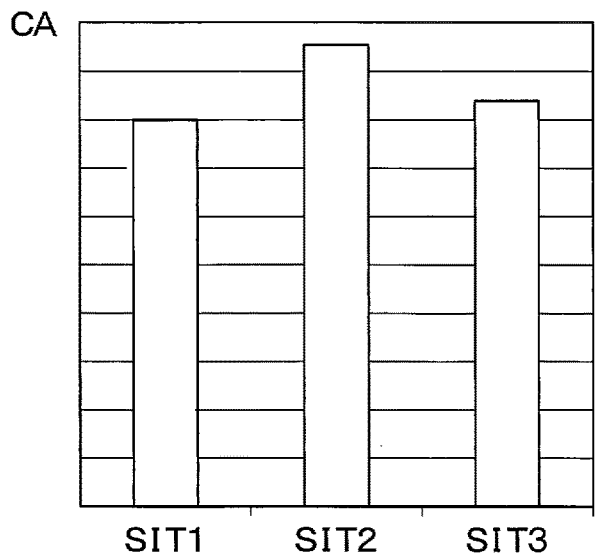
FIG. 6B is a graph of results of the computer simulation.

FIG. 6A shows simulation results when the guard electrode 42 is not present. FIG. 6B shows simulation results when the guard electrode 42 is present. In FIGS. 6A and 6B, SIT1 indicates situation 1, SIT2 indicates situation 2, and SIT3 indicates situation 3. In addition, a vertical axis CA indicates the electrostatic capacitance.

As shown in FIG. 6A, when the guard electrode 42 is not present, the changes in the electrostatic capacitance are greater regarding the adhesion of water S2 on the back side of the auxiliary component 8 than the adhesion of snow S1 on the detection surface 20*d*. In contrast, as shown in FIG. 6B, when the guard electrode 42 is present, the changes in the electrostatic capacitance are greater regarding the adhesion of snow S1 on the detection surface 20*d* than the adhesion of water S2 on the back side of the auxiliary component 8.

As described above, in the configuration according to the present embodiment, the changes in the electrical characteristic between the reference electrode 21*c* and the detection electrode 41 caused by water in the case of an occurrence of condensation and the like on the bumper back surface V32 can be favorably suppressed. In addition, as a result of this configuration, effects on the parasitic capacitance by the wire harness can be favorably suppressed. Therefore, as a result of this configuration, adhering substance detection using the changes in the electrical characteristic, that is, the electrostatic capacitance between the reference electrode 21 and the detection electrode 41 can be performed with even more favorable accuracy.

In the configuration according to the present embodiment, the guard electrode 42 is provided so as to have the same potential as the detection electrode 41. Therefore, power supply to the detection electrode 41 and the guard electrode 42 can be facilitated. In addition, as a result of the reference electrode 21*c* having the same potential as the ground of the vehicle body V1, acquisition of the electrical characteristic, that is, the electrostatic capacitance can be stably performed.

In the configuration according to the present embodiment, the detection electrode 41 and the guard electrode 42 are provided in the auxiliary component 8 that is a component that is used to mount the ultrasonic sensor 1 to the vehicle V. Therefore, a special work process to set the detection electrode 41 and the guard electrode 42 are not required. Consequently, as a result of this configuration, the configuration for detecting the adhering substances S is actualized by a mounting process that is similar to that of the conventional ultrasonic sensor 1. In addition, positional relationships among the reference electrode 21*c*, the detection electrode 41, and the guard electrode 42 can be stabilized. Therefore, the adhering substance detection using the changes in the electrical characteristic between the reference electrode 21*c* and the detection electrode 41 can be performed with even more favorable accuracy.

In the configuration according to the present embodiment, the detection electrode 41 is provided along the bumper back surface V32. In addition, the guard electrode 42 is provided along the diaphragm supporting portion 20*b*. In this configuration, even when condensation along the bumper back surface V32 occurs, effects on the changes in the electrostatic capacitance accompanying the condensation can be favorably suppressed by the guard electrode 42. In addition, even when condensation along the diaphragm supporting portion 20*b* occurs, effects on the changes in the electrostatic capacitance accompanying the condensation can be favorably suppressed by the guard electrode 42. Furthermore, effects on the changes in the electrostatic capacitance accompanying infiltration of water between the holding portion 81 of the auxiliary component 8 and the microphone case 20 can be favorably suppressed by the guard electrode 42.

In the configuration according to the present embodiment, the diaphragm portion 20*a* is formed into a shape that has the long direction and the short direction in a plane that is orthogonal to the directivity axis DA. In addition, the conductor portion 20*n* that configures the power supply path to the detection electrode 41 is provided in the thick portion 20*f* that is the portion along the long direction of the diaphragm support portion 20*b*.

The thick portion 20*f* has less effect on vibration characteristics of the diaphragm portion 20*a* as a result of a groove or an addition being provided than the thin portion 20*g* is. Therefore, the engaging groove 20*k* is provided in the thick portion 20*f* rather than the thin portion 20*g* is. In a similar manner, the conductor portion 20*n* that configures the power supply path to the detection electrode 41 is also provided in the thick portion 20*f* rather than the thin portion 20*g* is. Consequently, as a result of this configuration, manufacturing cost of providing the power supply path to the detection electrode 41 can be favorably reduced while the effects on the vibration characteristics of the diaphragm portion 20a are suppressed as much as possible.

Modifications

The present disclosure is not limited to the above-described embodiment. Therefore, modifications can be made as appropriate to the above-described embodiment. Typical modifications will be described below. In the descriptions of the modifications below, differences with the above-described embodiment will mainly be described. In addition, sections according to the above-described embodiment and in the modifications that are identical or equivalent to each other are given the same reference numbers. Therefore, in the descriptions of the modifications below, regarding constituent elements of which the reference numbers are the same as those according to the above-described embodiment, the descriptions according to the above-described embodiment are applicable unless technical inconsistencies are present or additional descriptions are particularly given.

The components of the vehicle body V1 to which the ultrasonic sensor 1 is mounted are not limited to the front bumper V3 and the rear bumper V4. That is, for example, the ultrasonic sensor 1 may be mounted to the vehicle-body panel V2 as well. In this case, the detection electrode 41 can be provided along the vehicle-body panel V2.

The mounting subject of the ultrasonic sensor 1 is not limited to the vehicle V. That is, for example, the ultrasonic sensor 1 may be mounted to conveyors that are provided in factories and the like, agricultural equipment (such as cultivators), aircraft, and the like.

The ultrasonic sensor 1 is not limited to the so-called transmission/reception configuration. That is, the ultrasonic sensor 1 that is dedicated to transmission of probe waves and the ultrasonic sensor 1 that is dedicated to reception of reflected waves may be separately mounted to the vehicle V. The present disclosure can be favorably applied to cases such as this as well.

According to the above-described embodiment, the microphone case 20 is seamlessly integrally formed by an insulating synthetic resin. However, the present disclosure is not limited to this mode. That is, for example, the microphone case 20 may be configured such that the diaphragm portion 20a and the diaphragm supporting portion 20b that are formed into separate parts are joined. In this case, the diaphragm portion 20a and the diaphragm supporting portion 20b may be formed by a same material or by differing materials.

The overall microphone case 20 or a portion thereof may be formed by a conductive or semi-conductive material. Specifically, for example, at least the diaphragm portion 20a of the microphone case 20 may be formed by a good conductive metal such as aluminum. In this case, the reference electrode 21c according to the above-described embodiment that serves as the first electrode may be integrated with the microphone case 20. Integrated in this case is not limited to two constituent elements being joined together. That is, integrated also includes two constituent elements being fused, or in other words, a single member being used as two constituent elements.

Specifically, for example, the reference electrode 21c may be integrated with the microphone case 20 by being joined to the diaphragm portion 20a by a conductive adhesive. That is, the reference electrode 21c can be grounded by being electrically connected to the diaphragm portion 20a by a conductive adhesive. In this configuration, a joined body of the reference electrode 21c and the diaphragm portion 20a can function as the first electrode.

Alternatively, the diaphragm portion 20a can be used as both a grounding-side electrode of the vibration element 21 and the first electrode for adhering substance detection. That is, the diaphragm portion 20a that is considered to be same as the reference electrode 21c can function as the first electrode. In this case, the piezoelectric body 21a can be attached to the element fixing surface 20e of the diaphragm portion 20a by an adhesive.

An example in which the overall microphone case 20 is formed by a good conductive metal such as aluminum will be described. In this example, as shown in FIG. 7, the microphone case 2 is integrated with the reference electrode 21c as that which configures the reference electrode 21c.

That is, with reference to FIG. 7, in the present modification, the microphone case 20 is seamlessly integrally formed by a good conductive metal such as aluminum. In this case, the piezoelectric body 21a can be attached to the element fixing surface 20e of the diaphragm portion 20a by a conductive adhesive.

As a result of this configuration, the microphone case 20 can be used as the first electrode. Therefore, acquisition of the electrical characteristic, that is, the electrostatic capacitance between the microphone case 20 that serves as the first electrode and the detection electrode 41 can be stably performed. In addition, the microphone case 20 can be used as that which is both the first electrode and the grounding-side electrode of the vibration element 21. Consequently, reduction in manufacturing cost through reduction in a number of components is achieved.

The vibration element 21 is not limited to the piezoelectric element. That is, for example, the ultrasonic microphone 2 may have a configuration of an electrostatic-capacitance-type microphone.

The configuration of the detection electrode 41 is also not limited to the above-described specific example. That is, for example, the shape of the detection electrode 41 is not limited to the sheet shape or the film shape, and may be a mesh shape, a bar shape, a coil shape, or the like. In addition, as a result of the detection electrode 41 being arranged in a substantially center portion in the thickness direction of the flange portion 82, the detection electrode 41 may be embedded inside the flange portion 82. In other words, the detection electrode 41 may be arranged so as to be separated from the bumper opposing surface 83 of the flange portion 82 in the directivity axis direction.

A plurality of detection electrodes 41 may be arrayed in a predetermined direction (such as the in-plane direction). Specifically, for example, a plurality of detection electrodes 41 that are arrayed in the radial direction and/or the circumferential direction may be provided so as to not be conductive with one another. In this case, the control unit 54a can detect the presence/absence of adhering substances S and adhering positions based on changes in the electrical characteristic (that is, the electrostatic capacitance) between each of the plurality of detection electrodes 41 and the reference electrode 21c.

According to the above-described embodiment, the detection electrode 41 and the guard electrode 42 are both provided in the auxiliary component 8. However, the present disclosure is not limited to this mode. That is, for example, only either of the detection electrode 41 and the guard electrode 42 may be provided in the auxiliary component 8.

The detection electrode 41 may not be provided in the auxiliary component 8. That is, for example, the detection electrode 41 may be fixed to the bumper back surface V32.

Specifically, for example, the detection electrode 41 may be embedded around the attachment hole V33 of the front bumper V3. Alternatively, the detection electrode 41 may be a portion of the front bumper V3 that is formed by a conductive filler being added to a portion of the front bumper V3 that faces the attachment hole V33.

The detection electrode 41 may be provided in the elastic supporting member 3. That is, for example, the ring-shaped detection electrode 41 may be embedded in the tip end portion in the directivity axis direction of the elastic supporting member 3. Alternatively, for example, as a result of the overall elastic supporting member 3 or at least the tip end portion in the directivity axis direction being conductive, the overall elastic supporting member 3 or at least the tip end portion in the directivity axis direction may be used as the detection electrode 41. Here, as described above, the shape of the detection electrode 41 is not limited to a specific shape. An arbitrary shape other than the ring shape can be used.

In the above-described specific example, the guard electrode 42 being provided so as to have the same potential as the detection electrode 41 does not mean that the potentials of both completely coincide as a result. That is, for example, as long as both are supplied power by being electrically connected to a common power source by wiring, a slight potential difference may be present between both. In addition, the guard electrode 42 may be provided so as to have the same potential as the reference electrode 21*c* or the microphone case 20 that serves as the first electrode. In this case, the guard electrode 42 can be grounded. The same potential in this case as well does not mean that the potentials of both completely coincide as a result. Therefore, the same potential can also be referred to as substantially the same potential.

The configuration of the guard electrode 42 is also not limited to the above-described specific example. That is, for example, the shape of the guard electrode 42 is not limited to the sheet shape or the film shape, and may be a mesh shape, a bar shape, a coil shape, or the like. In addition, a plurality of guard electrodes 42 may be arrayed in a predetermined direction, such as the directivity axis direction and/or the circumferential direction.

The guard electrode 42 may not be provided in the auxiliary component 8. That is, for example, the guard electrode 42 may be fixed on the outer circumferential surface 20*h* of the diaphragm supporting portion 20*b* that is formed by an insulating material. Alternatively, for example, the guard electrode 42 may be joined on the outer circumferential surface 20*h* of the diaphragm portion 20*b* that is formed by a conductive material via an insulating layer.

The guard electrode 42 may be provided in the elastic supporting member 3. In this configuration as well, a special work process for setting the guard electrode 42 is not required. Specifically, for example, the ring-shaped or circular cylindrical guard electrode 42 that has a center axis along the directivity axis direction may be embedded in the elastic supporting member 3 that is composed of an insulating synthetic resin. Alternatively, for example, as a result of the overall elastic supporting member 3 or a portion thereof being formed by a conductive rubber, the overall elastic supporting member 3 or a portion thereof 3 may be used as the guard electrode 42.

The guard electrode 42 may be provided along the detection electrode 41. That is, for example, as shown in FIGS. 8 and 9, the guard electrode 42 may be laminated with the detection electrode 41 via an insulating layer 87. Here, in the examples in FIGS. 8 and 9, the overall microphone case 20 is formed by a good conductive metal such as aluminum in a manner similar to that in the example in FIG. 7.

In the example in FIG. 8, the detection electrode 41 is formed into a thin plate or a thin film that is flat and has a thickness direction in the directivity axis direction. That is, the detection electrode 41 is provided along the bumper back surface V32 of the front bumper V3. Specifically, in the mounted state, the detection electrode 41 is arranged near the attachment hole V33 while opposing the bumper back surface V32 in a closely adhered state.

The guard electrode 42 is formed into a thin sheet or a thin film. The guard electrode 42 has a substantially U-like shape that surrounds the detection electrode 41 from the base end side in the directivity axis direction, from a cross-sectional view on a plane that includes the directivity axis DA. Specifically, the guard electrode 42 includes a ring electrode portion 421, an inner protruding portion 422, and an outer protruding portion 423.

The ring electrode portion 421 is a thin-sheet or thin-film portion that has a thickness direction in the directivity axis direction, and is arranged in parallel with the detection electrode 41. The inner protruding portion 422 protrude towards the tip end side in the directivity axis direction from an inner edge in the radial direction of the ring electrode portion 42. The inner protruding portion 422 is provided such that a tip end in the directivity axis direction extends to a position that is flush with the bumper opposing surface 83, further towards the inner side in the radial direction than the detection electrode 41 is. The outer protruding portion 423 protrude towards the tip end side in the directivity axis direction from an outer edge in the radial direction of the ring electrode portion 421. The outer protruding portion 423 is provided such that a tip end in the directivity axis direction extends to a position that is flush with the bumper opposing surface 83, further towards the outer side in the radial direction than the detection electrode 41 is.

The insulating layer 87 is provided between the detection electrode 41 and the guard electrode 42. That is, the insulating layer 87 has a substantially U-like shape that covers the detection electrode 41 from the base end side in the directivity axis direction, from a cross-sectional view on a plane that includes the directivity axis DA. The insulating layer 87 is formed by an insulating synthetic resin that composes the auxiliary component 8.

In this configuration, the positional relationship between the detection electrode 41 and the guard electrode 42 can be fixed as a result of the guard electrode 42 being laminated with the detection electrode 41 in a fixed manner via the insulating layer 87. In addition, a joined body of the detection electrode 41, the insulating layer 87, and the guard electrode 42 is supported in a fixed manner by the flange portion 82 of the auxiliary component 8. Consequently, as a result of this configuration, detection error caused by assembly error and the like can be favorably suppressed.

FIG. 9 shows an example in which the joined body of the detection electrode 41, the insulating layer 87, and the guard electrode 42 shown in FIG. 8 is supported in a fixed manner by the holding portion 81 of the auxiliary component 8. That is, the example in FIG. 9 is a partial modification of the configuration in FIG. 8 and a partial modification of the configuration in FIG. 7.

In the example in FIG. 9, the detection electrode 41 is a thin-sheet or thin-film member that has a thickness direction in the radial direction. The detection electrode 41 is formed into a circular cylindrical shape or a partial circular cylindrical shape that surrounds the directivity axis DA and extends in the directivity axis direction. The detection electrode 41 is arranged further towards the outer side in the radial direction than the guard electrode 42 is. That is, the detection electrode 41 is embedded inside the holding portion 81 so as to be arranged in an intermediate position in the thickness direction of the holding portion 81 that has a thickness direction in the radial direction.

The guard electrode 42 is a thin-sheet or thin-film member that has a thickness direction in the radial direction. The guard electrode 42 is formed into a circular cylindrical shape or a partial circular cylindrical shape that surrounds the directivity axis DA and extends in the directivity axis direction. The guard electrode 42 is arranged between the microphone case 20 and the detection electrode 41. Specifically, the guard electrode 42 is fixed on the inner circumferential surface 85 side so as to be flush with the inner circumferential surface 85 that is a circular cylindrical surface of the holding portion 81.

The insulating layer 87 is a thin-sheet or thin-film portion that has a thickness direction in the radial direction. The insulating layer 87 is formed into a circular cylindrical shape or a partial circular cylindrical shape that surrounds the directivity axis DA and extends in the directivity axis direction. The guard electrode 42, the insulating layer 87, and the detection electrode 41 are concentrically arrayed so as to be in a line towards the outer side in the radial direction in this order. The insulating layer 87 is formed by an insulating synthetic resin that composes the auxiliary component 8.

In this configuration, the positional relationship between the detection electrode 41 and the guard electrode 42 can be fixed as a result of the guard electrode 42 being laminated with the detection electrode 41 in a fixed manner via the insulating layer 87. In addition, a joined body of the detection electrode 41, the insulating layer 87, and the guard electrode 42 is supported in a fixed manner by the holding portion 81 of the auxiliary component 8. Consequently, as a result of this configuration, detection error caused by assembly error and the like can be favorably suppressed.

In the configuration shown in FIG. 9, the guard electrode 42 may be fixed on the outer circumferential surface 20h of the diaphragm portion 20b that is formed by an insulating material. Alternatively, for example, the guard electrode 42 may be joined on the outer circumferential surface 20h of the diaphragm supporting portion 20b that is formed by a conductive material, via an insulating layer. Alternatively, for example, the guard electrode 42 may be provided in the elastic supporting member 3.

In FIGS. 8 and 9, the overall microphone case 20 is formed by a good conductive metal such as aluminum, in a manner similar to that in the example in FIG. 7. However, the present disclosure is not limited to this mode. That is, in the configurations shown in FIGS. 8 and 9, the overall microphone case 20 or a portion thereof may have insulating properties.

Figure 3:
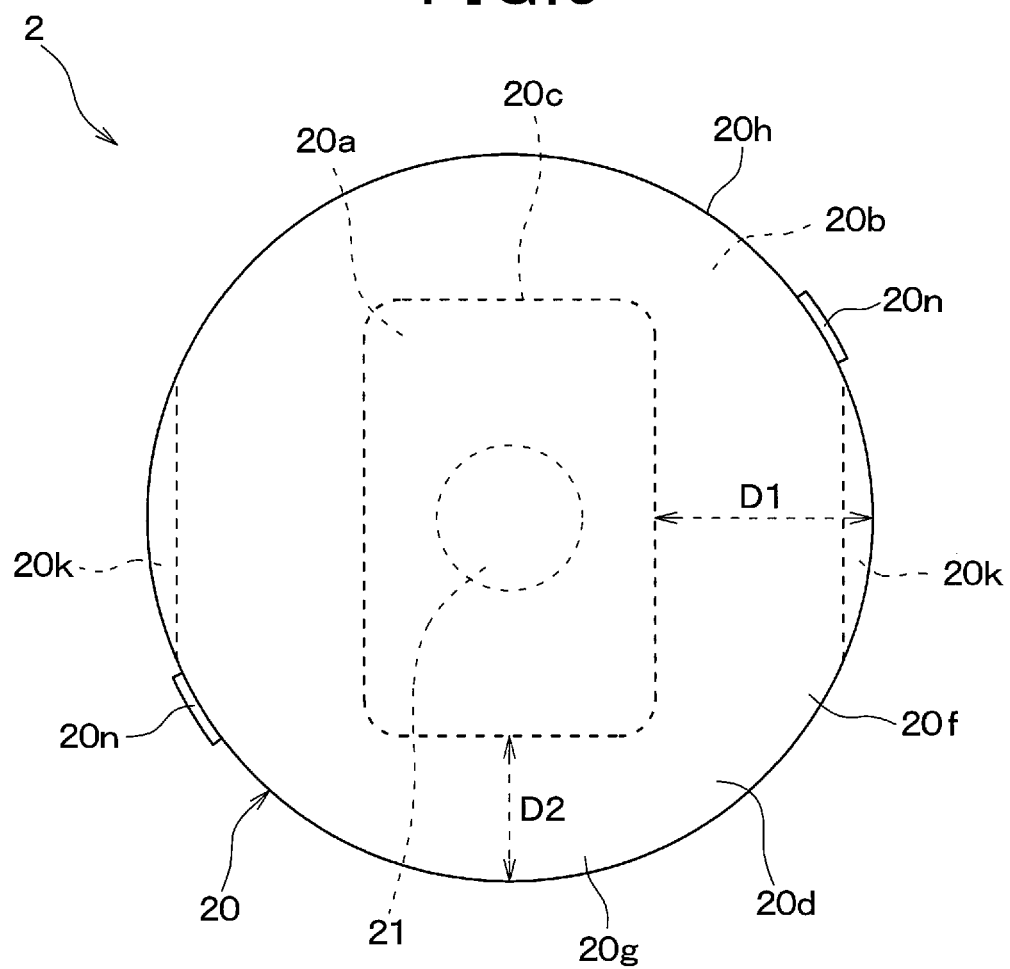
FIG. 3 is a front view of an outer appearance of an ultrasonic microphone shown in FIG. 2.

According to the above-described embodiment, the conductor portion 20n shown in FIG. 3 is provided so as to configure a portion of the detection wiring 52. However, the present disclosure is not limited to this mode. That is, for example, the conductor portion 20n may be provided so as to configure a portion of the guard wiring 53. Alternatively, for example, the conductor portion 20n may be provided so as to configure a portion of the detection wiring 52 and a portion of the guard wiring 53.

The control circuit apparatus 54 can be configured by hardware such as an ASIC. ASIC is an abbreviation of Application Specific Integrated Circuit.

The guard electrode 42 can be used for detection of water infiltration or condensation. That is, for example, water infiltration may occur between the holding portion 81 of the auxiliary component 8 and the microphone case 20. Alternatively, condensation may occur along the bumper back surface V32. As a result of these occurrences, an electrical characteristic, that is, an electrostatic capacitance between the reference electrode 21c and the guard electrode 42 changes. Here, as a result of the changes in the electrical characteristic being detected, these occurrences can be favorably detected.

As described above, the movement of the wire harness, infiltration of water, occurrence of condensation, and the like in an area inside the front bumper V3 become a factor for error or a noise component during detection of substances S adhering to the detection surface 20d. The factor for error or the noise component can be measured using the guard electrode 42.

Here, the control unit 54a may perform adhering substance detection taking into consideration the changes in the electrical characteristic, that is, the electrostatic capacitance between the reference electrode 21c and the guard electrode 42. That is, the ultrasonic sensor 1 is configured to be capable of detecting the adhesion of substances S adhering to the detection surface 20d based on the electrical characteristic between the reference electrode 21c and the detection electrode 41, and the electrical characteristic between the detection electrode 41 and the guard electrode 42.

As a result of this configuration, the control unit 54a acquires the changes in the electrical characteristic, that is, the electrostatic capacitance between the reference electrode 21c and the detection electrode 41. In addition, the control unit 54a acquires the changes in the electrical characteristic, that is, the electrostatic capacitance between the detection electrode 41 and the guard electrode 42. Then, the control unit 54a detects the adhesion of substances S adhering to the detection surface 20d based on these acquisition results. As a result, adhering substance detection using the changes in the electrical characteristic between the reference electrode 21c and the detection electrode 41 can be performed with even more favorable accuracy.

Figure 10:
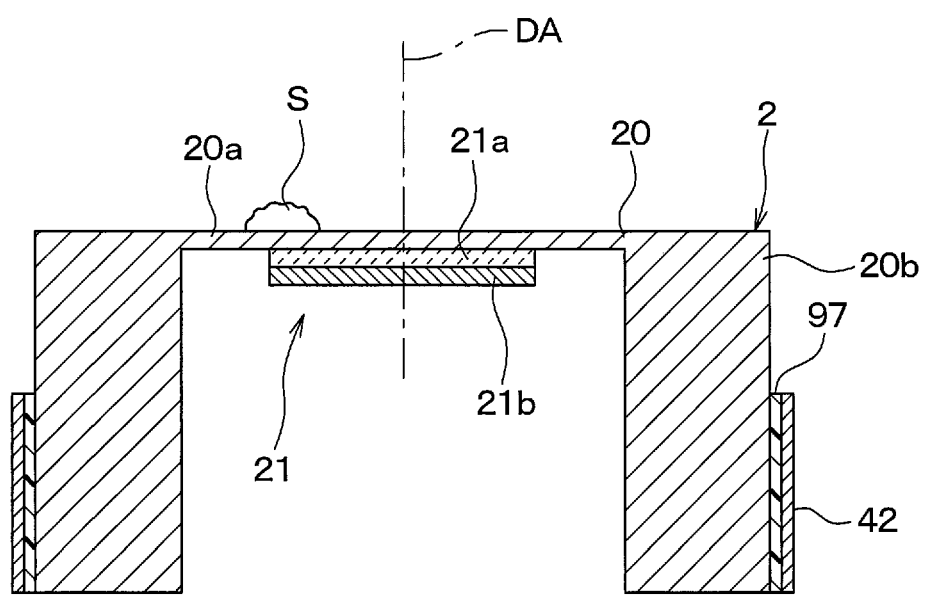
FIG. 10 is a cross-sectional side view of an overall configuration of still another modification of the ultrasonic sensor shown in FIG. 2.

As shown in FIG. 10, the guard electrode 42 that serves as the third electrode may be laminated with the microphone case 20 that serves as the first electrode via the insulating layer 97. Specifically, for example, with reference to FIG. 10, the guard electrode 42 may be provided along the diaphragm supporting portion 20b. In addition, the guard electrode 42 is provided so as to cover substantially half of the diagraph supporting portion 20b on the base end side in the directivity axis direction. The insulating layer 97 is provided between the guard electrode 42 and the diaphragm supporting portion 20b. For example, the insulating layer 97 may be formed by an insulating adhesive or the like.

In this configuration, the positional relationship between the guard electrode 42 that serves as the third electrode and the microphone case 20 that configures the first electrode can be favorably fixed. Therefore, a guard effect of the guard electrode 42 can be stably achieved. In addition, as a result of the guard electrode 42 covering substantially half of the microphone case 20 that configures the first electrode on the base end side in the directivity axis direction, changes in the electrical characteristic caused by factors other than the adhesion of substances S adhering to the ultrasonic microphone 2 can be favorably suppressed. Therefore, adhering substance detection can be performed with even more favorable accuracy.

Here, the configuration in which the first electrode and the third electrode are laminated via the insulating layer 97 is not limited to the specific example shown in FIG. 10. That is, for example, in the configuration shown in FIG. 2, a laminated body of the insulating layer 97 and the guard electrode 42 may be provided so as to surround the periphery of the laminated body of the piezoelectric body 21*a* and the driving electrode 21*b*.

In the above-described specific example, the adhering substance detection operation is performed by the control circuit apparatus 54, that is, the control unit 54*a*. Therefore, the control circuit apparatus 54, that is, the control unit 54*a* can be evaluated as a detecting unit that detects an adhesion state of adhering substances S based on an electrical characteristic between the first electrode and the second electrode. However, the present disclosure is not limited to this mode. That is, for example, the adhering substance detection operation may be performed by an onboard ECU that is electrically connected to the ultrasonic sensor 1. ECU is an abbreviation of Electronic Control Unit.

The guard voltage applying unit 54*g* is not limited to the voltage follower. That is, for example, a so-called isolation amplifier may be used as the guard voltage applying unit 54*g*.

The configuration of the auxiliary component 8 is also not particularly limited. That is, the shape and structure of the auxiliary component 8 in the above-described specific example are simplified to prevent complexity in the description. Therefore, the present disclosure is not limited to the shape and structure of the auxiliary component 8 in the above-described specific example. Consequently, for example, the auxiliary component 8 may be a component that is referred to as a retainer or a component that is referred to as a bezel. In addition, the overall auxiliary component 8 or a portion thereof may be integrated with the sensor case 6.

In the above-described description, a plurality of constituent elements that are seamlessly integrally formed together may be formed by separate components being attached to each other. In a similar manner, a plurality of constituent elements that are formed by separate components being attached to each other may be seamlessly integrally formed together.

In the above-described description, a plurality of constituent elements that are formed by the same material as each other may be formed by materials that differ from each other. In a similar manner, a plurality of components that are formed by materials that differ from each other may be formed by the same material as each other.

It goes without saying that an element that configures the above-described embodiment is not necessarily a requisite unless particularly specified as being a requisite, clearly considered a requisite in principle, or the like. In addition, in cases in which a numeric value, such as quantity, numeric value, amount, or range, of a constituent element is mentioned, the present disclosure is not limited to the specific number unless particularly specified as being a requisite, clearly limited to the specific number in principle, or the like. In a similar manner, in cases in which a shape, direction, positional relationship, or the like of a constituent element or the like is mentioned, the present disclosure is not limited to the shape, direction, positional relationship, or the like unless particularly specified as being a requisite, limited to a specific shape, direction, positional relationship, or the like in principle, or the like.

The modifications are also not limited to the examples described above. In addition, a plurality of modifications may be combined. Furthermore, the above-described embodiment in its entirety or in part and an arbitrary modification in its entirety or in part may be combined.

What is claimed is:

1. An ultrasonic sensor comprising:
   a first electrode that is provided in an ultrasonic microphone that includes a vibration element that provides a function for converting between mechanical vibrations and electrical signals;
   a second electrode that is externally from the ultrasonic microphone such that an electrical characteristic between the second electrode and the first electrode changes based on an adhesion state of substances adhering to the ultrasonic microphone; and
   a third electrode that is provided so as to suppress changes in the electrical characteristic between the first electrode and the second electrode caused by factors other than the adhesion of substances adhering to the ultrasonic microphone.

2. The ultrasonic sensor according to claim 1, wherein:
   the third electrode is provided so as to be interposed between the first electrode and the second electrode.

3. The ultrasonic sensor according to claim 1, wherein:
   the third electrode is provided so as to have a same potential as the first electrode or the second electrode.

4. The ultrasonic sensor according to claim 1, wherein:
   the second electrode or the third electric is provided in an auxiliary component that is a component that is used to mount the ultrasonic sensor to a mounting subject.

5. The ultrasonic sensor according to claim 1, wherein:
   the third electrode is laminated with the first electrode or the second electrode via an insulating layer.

6. The ultrasonic sensor according to claim 1, wherein:
   the ultrasonic microphone includes
      microphone case that includes a diaphragm portion that is formed into a thin sheet so as to ultrasonically vibrate, and
      diaphragm supporting portion that is formed into a cylindrical shape in which a directivity axis along a vibration direction of the diaphragm portion is a center axis and is provided so as to support the diaphragm portion in an outer edge portion of the diaphragm portion; and
   the vibration element is supported by the diaphragm portion in a fixed manner.

7. The ultrasonic sensor according to claim 6, wherein:
   the microphone case is formed by a conductive material; and
   the first electrode is integrated with the microphone case.

8. The ultrasonic sensor according to claim 6, wherein:
   the third electrode is provided so as to suppress the changes in the electrical characteristic between the first electrode and the second electrode that are caused by factors other than the adhesion of substances adhering to a detection surface that is an outer surface of the diaphragm portion and is exposed towards an outer side of a mounting subject in a state in which the ultrasonic sensor is mounted to an exterior shell of the mounting subject; and
   the adhesion of substances adhering to the detection surface can be detected based on the electrical characteristic between the first electrode and the second electrode.

9. The ultrasonic sensor according to claim 8, wherein:
   the second electrode is provided along a back surface of the exterior shell.

10. The ultrasonic sensor according to claim 8, wherein:
the third electrode is provided along the diaphragm supporting portion.

11. The ultrasonic sensor according to claim 8, wherein:
the adhesion of substances adhering to the detection surface can be detected based on the electrical characteristic between the first electrode and the second electrode and an electrical characteristic between the second electrode and the third electrode.

12. The ultrasonic sensor according to claim 6, wherein:
the diaphragm portion is formed in a shape that has a long direction and a short direction in a plane that is orthogonal to the directivity axis; and
a conductor portion that configures a power supply path to the second electrode or the third electrode is provided in a thick portion that is a portion along the long direction of the diaphragm supporting portion.

13. The ultrasonic sensor according to claim 1, wherein:
the electrical characteristic is an electrostatic capacitance.

* * * * *